United States Patent
Oh et al.

(10) Patent No.: US 7,586,776 B2
(45) Date of Patent: Sep. 8, 2009

(54) NONVOLATILE MEMORY DEVICES HAVING MULTI-FILAMENT VARIABLE RESISTIVITY MEMORY CELLS THEREIN

(75) Inventors: Hyung-rok Oh, Gyeonggi-do (KR); Sang-beom Kang, Gyeonggi-do (KR); Woo-yeong Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 99 days.

(21) Appl. No.: 11/945,420

(22) Filed: Nov. 27, 2007

(65) Prior Publication Data

US 2008/0144356 A1    Jun. 19, 2008

(30) Foreign Application Priority Data

Dec. 13, 2006   (KR) ............... 10-2006-0127280

(51) Int. Cl.
    *G11C 11/00* (2006.01)
(52) U.S. Cl. .............. 365/148; 365/225.5; 365/153; 365/158
(58) Field of Classification Search ........... 365/148, 365/225.5, 153, 158
    See application file for complete search history.

(56) References Cited

U.S. PATENT DOCUMENTS

| | | | |
|---|---|---|---|
| 6,392,931 | B1 | 5/2002 | Pasotti et al. |
| 6,768,665 | B2 | 7/2004 | Parkinson et al. |
| 6,951,805 | B2 | 10/2005 | Moore |
| 2004/0027849 | A1 | 2/2004 | Yang et al. |
| 2005/0058009 | A1 | 3/2005 | Yang et al. |
| 2007/0069427 | A1* | 3/2007 | Long et al. .............. 264/430 |
| 2007/0115714 | A1 | 5/2007 | Muraoka et al. |
| 2008/0143195 | A1* | 6/2008 | Hampikian et al. .......... 310/26 |
| 2009/0092817 | A1* | 4/2009 | Mullner et al. .......... 428/304.4 |

FOREIGN PATENT DOCUMENTS

| KR | 1020050025730 A | 3/2005 |
|---|---|---|
| KR | 10-2006-0106849 A | 10/2006 |

OTHER PUBLICATIONS

Korean Office Action, Korean Patent Application No. 10-2006-0127280, Feb. 19, 2008.
"Perovskite," Printed from http://en.wikipedia.org/wiki/Pervskite on Jun. 10, 2007.

\* cited by examiner

*Primary Examiner*—Connie C Yoha
(74) *Attorney, Agent, or Firm*—Myers Bigel Sibley & Sajovec, P.A.

(57) ABSTRACT

There is provided a resistive memory device, the device including: a plurality of word lines and a plurality of bit lines arranged such that the word lines intersect the bit lines; a plurality of resistive memory cells each having a variable resistive material coupled between the corresponding word line and the corresponding bit line and an access element; selecting circuits selecting one of the plurality of resistive memory cells; and a filament-forming circuit supplying a filament-forming voltage to the selected resistive memory cell through the bit line coupled to the selected resistive memory cell while increasing the filament-forming voltage from a predetermined voltage level until filaments having a predetermined thickness are formed in the variable resistive material of the selected resistive memory cell.

24 Claims, 11 Drawing Sheets

(a) forming filaments (b) RESET state (c) SET state

Vform1 ≠ Vform2 ≠ Vform3 ≠ Vform4

NONVOLATILE MEMORY DEVICES HAVING MULTI-FILAMENT VARIABLE RESISTIVITY MEMORY CELLS THEREIN

REFERENCE TO PRIORITY APPLICATION

This application claims the benefit of Korean Application No. 2006-127280, filed Dec. 13, 2006, the disclosure of which is hereby incorporated herein by reference.

FIELD OF THE INVENTION

The present invention relates to integrated circuit memory devices and, more particularly, to non-volatile memory devices.

BACKGROUND OF THE INVENTION

Memory devices that use resistance materials include resistive RAMs (RRAM), phase change random access memories (PRAM), ferroelectric RAMs (FRAM), magnetic RAMs (MRAM), etc. Dynamic RAMs (DRAM) or flash memory devices store data using stored charge, while some other nonvolatile memory devices store data by using a variation in the resistance of a variable resistance material (RRAM), a variation in the state of a phase change material, such as a chalcogenide alloy (PRAM), a polarization phenomenon of a ferroelectric material (FRAM), or a variation in the resistance of a magnetic tunnel junction film (MTJ film) according to the magnetized state of a ferroelectric material (MRAM), for example.

FIG. 1 is a view illustrating a resistive memory cell. Referring to FIG. 1, a resistive memory cell includes an upper electrode 1, a lower electrode 3, and a variable resistive material 2 interposed therebetween. The resistance level of the variable resistive material is changed according to a voltage applied to the upper and lower electrodes 1 and 3. An example of such a resistive memory cell is disclosed in U.S. Patent Application Publication Nos. 2005-58009 and 2004-27849.

When the resistive memory device is fabricated and a filament-forming voltage having a considerably high level is applied to the resistive memory cells including the variable resistive material 2, filaments 4 are formed in the variable resistive material 2 (see (A) of FIG. 1). The filaments 4 form a current path of a cell current flowing between the upper electrode 1 and the lower electrode 3. After the filaments 4 are formed, a reset voltage may be applied so as to make the variable resistive material 2 be in a reset state (see (B) of FIG. 1) or a set voltage may be applied to make the variable resistive material 2 be in a set state (see (C) of FIG. 1). Here, the reset state means a relatively high-resistance state in which filaments 4a in the variable resistive material 2 are in an open state and can be defined as data "1", and the set state means a relatively low-resistance state in which filaments 4b in the variable resistive material 2 are in a short state and can be defined as data "0". Typically, when it is assumed that the filament-forming voltage is $V_{form}$, the set voltage is Vset, and the reset voltage is Vreset, the following relationship is established: $V_{form} > Vset > Vreset$.

In the resistive memory device according to the related art, the filament-forming voltage having the same level is applied to all of the resistive memory cells. Since the filament-forming voltage may be a relatively high level, the variable resistive material 2 may be partially broken down, or the filaments may be formed to be excessively thick such that transition from the reset state to the set state or transition from the set state to the reset state can become difficult.

SUMMARY OF THE INVENTION

Embodiments of the present invention include non-volatile integrated circuit memory devices that utilize variable resistivity materials (e.g., perovskite materials) for data retention. According to some of these embodiments, a non-volatile memory device includes an array of memory cells having non-volatile data storage regions therein that are formed from multi-filament variable resistivity materials. To improve programming reliability, a filament-forming circuit is provided. This filament-forming circuit is electrically coupled to a terminal of the memory cell during a filament-forming operation. The filament-forming circuit is configured to drive the terminal with a monotonically increasing sequence of voltages (e.g., filament-forming voltages) that operate to form filaments within the variable resistivity material during the filament-forming operation. This monotonically increasing sequence may be a stair-step sequence or a linear ramp-shaped sequence, for example.

According to some of these embodiments, the filament-forming circuit comprises a sense amplifier configured to sense a magnitude of the monotonically increasing sequence of voltages relative to a reference voltage. In particular, the filament-forming circuit may include a string of resistors connected in a totem-pole arrangement between first and second supply voltages (e.g., Vdd and Vss/Gnd) and may be configured to sequentially connect nodes of the string of resistors to the terminal of the memory cell during the filament-forming operation.

Still further embodiments of the invention include a non-volatile memory device having an array of memory cells therein. Each of these memory cells includes a non-volatile data storage region made from multi-filament variable resistivity materials. The memory device also includes a plurality of bit lines electrically coupled to corresponding columns of memory cells in the array and a filament-forming circuit. The filament-forming circuit is configured to generate a monotonically increasing sequence of voltages during a filament-forming operation. A column selecting circuit is also provided. This column selecting circuit is configured to route the monotonically increasing sequence of voltages from the filament-forming circuit to at least a selected one of the plurality of bit lines during the filament-forming operation. According to some of these embodiments, the filament-forming circuit includes a sense amplifier configured to sense a magnitude of the monotonically increasing sequence of voltages relative to a reference voltage. The sense amplifier may also be configured to generate an output signal having a value that reflects a magnitude of the monotonically increasing sequence of voltages relative to a magnitude of the reference voltage. This output signal may be provided to a control pulse generating circuit, which generates a sequence of control pulses.

The filament-forming circuit may also include a string of resistors connected in a totem-pole arrangement between first and second supply voltages. According to this embodiment, the filament-forming circuit is configured to sequentially connect nodes of the string of resistors to an output thereof during the filament-forming operation. Alternatively, instead of using a string of resistors, the filament-forming circuit may include a plurality of unequal current sources to charge a capacitor having an electrode that is connected to the output of the filament-forming circuit.

BRIEF DESCRIPTION OF THE DRAWINGS

The above and other features and advantages of the present invention will become more apparent by describing in detail preferred embodiments thereof with reference to the attached drawings in which.

DESCRIPTION OF THE PREFERRED EMBODIMENTS

Figure 1:
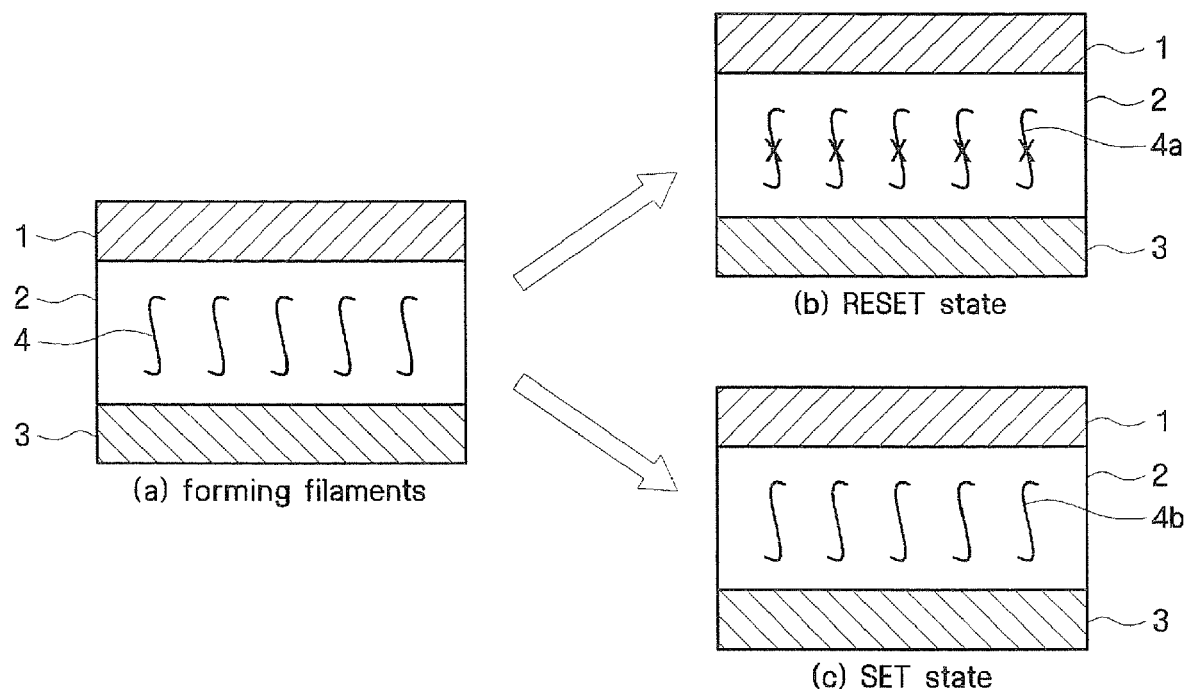
FIG. 1 is a view illustrating a conventional resistive memory cell.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The present invention will now be described more fully with reference to the accompanying drawings, in which preferred embodiments of the invention are shown. Hereinafter, the exemplary embodiments of the invention will be described below using a resistive RAM (RRAM). However, it will be understood by those skilled in the art that the invention may be applicable to other non-volatile memory devices using resistive materials, such as a phase change random access memory (PRAM), a ferroelectric RAM (FRAM), and a magnetic RAM (MRAM), for example.

Figure 2:
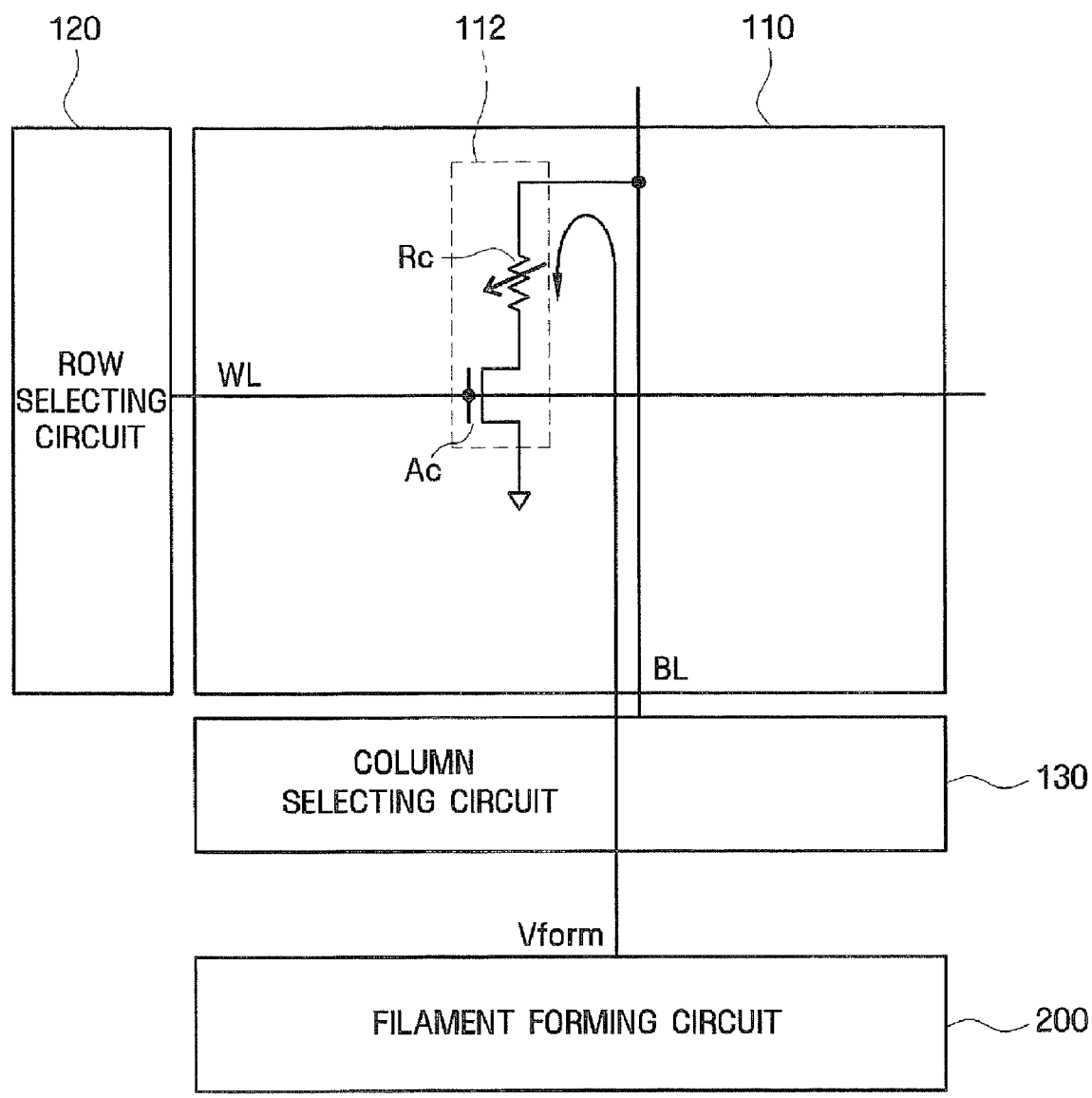
FIG. 2 is a block diagram illustrating a resistive memory device according to an embodiment of the invention.
Figure 3:
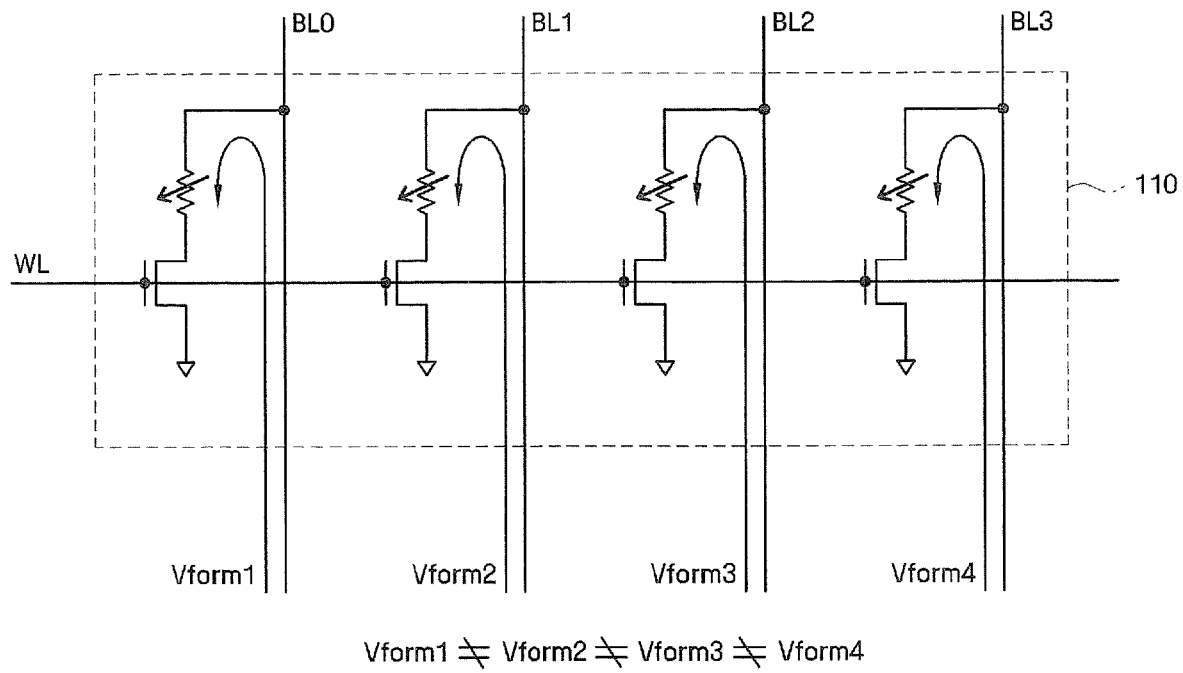
FIG. 3 is a view illustrating filament-forming voltages used for the resistive memory device according to embodiments of the invention.

FIG. 2 is a block diagram illustrating a resistive memory device according to an embodiment of the invention. FIG. 3 is a view illustrating a filament-forming voltage used for the resistive memory device according to an embodiment of the invention. FIGS. 4A to 4D are views illustrating filament-forming voltages used for the resistive memory device, according to embodiments of the invention. Referring to FIG. 2, a resistive memory device according to an embodiment of the invention includes a memory cell array 110, a row selecting circuit 120, a column selecting circuit 130, and a filament-forming circuit 200.

The memory cell array 110 includes a plurality of resistive memory cells 112. Each of the resistive memory cells 112 may include a variable resistive material Rc and an access element Ac that is coupled between a word line WL and a bit line BL. The resistance level of the variable resistive material Rc varies according to the data to be stored. The access element Ac controls a current flowing through the variable resistive material Rc. In FIG. 2, a transistor coupled in series to the variable resistive material Rc is used as the access element Ac, but the embodiment is not limited thereto. The variable resistive material Rc may contain, for example, perovskite. Perovskite may be a composition of manganite (such as $Pr_{0.7}Ca_{0.3}MnO_3$, $Pr_{0.5}Ca_{0.5}MnO_3$, PCMO, and LCMO), titanate (such as STO:Cr), and/or zirconate (such as SZO:Cr, $Ca_2Nb_2O_7$:Cr, and $Ta_2O_5$:Cr). Perovskite is exemplified as the variable resistive material Rc, but the embodiment is not limited thereto. For example, other materials, such as NiO, can be used as the variable resistive material Rc.

The row selecting circuit 120 receives a row address, performs decoding, and designates a row composed of a plurality of resistive cells. The column selecting circuit 130 receives a column address, performs decoding, and designates a column composed of a plurality of resistive cells. The filament-forming circuit 200 supplies a plurality of filament-forming voltages $V_{form}$ to the plurality of resistive memory cells 112 selected by the row selecting circuit 120 and the column selecting circuit 130 so as to form filaments in the variable resistive material Rc of each of the selected resistive memory cells 112. Each filament becomes a current path of a cell current flowing through each resistive memory cell 112. In particular, the filament-forming circuit 200 of the phase change memory device according to the embodiment of the invention adjusts the voltage levels of the plurality of filament-forming voltages to be supplied to the plurality of resistive memory cells 112 to voltage levels. For example, as shown in FIG. 3, when four resistive memory cells are selected from the memory cell array 110, the voltage levels of the filament-forming voltages $V_{form1}$, $V_{form2}$, $V_{form3}$, and $V_{form4}$ supplied to the four resistive memory cells may be different from one another ($V_{form1} \neq V_{form2} \neq V_{form3} \neq V_{form4}$). Alternatively, some of the filament-forming voltages supplied to the resistive memory cells may be equal to each other (for example, $V_{form1} = V_{form2} = V_{form3}$, and $V_{form3} \neq V_{form4}$).

Referring to FIG. 2 again, the filament-forming voltage $V_{form}$ is supplied to the resistive memory cell 112 through the bit line, but the invention is not limited thereto. It will be understood by those skilled in the art that various modifications and changes of the structure can be made.

Figure 4A:
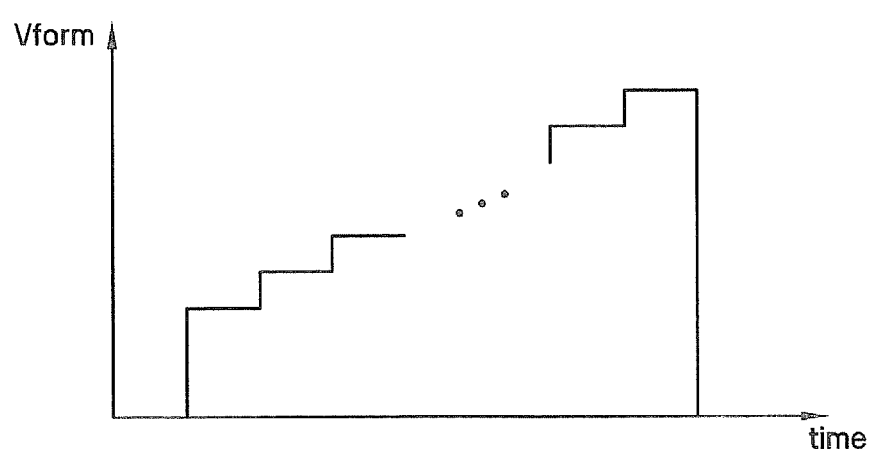
FIGS. 4A to 4D are views illustrating filament-forming voltages used for the resistive memory device according to embodiments of the invention.
Figure 4B:
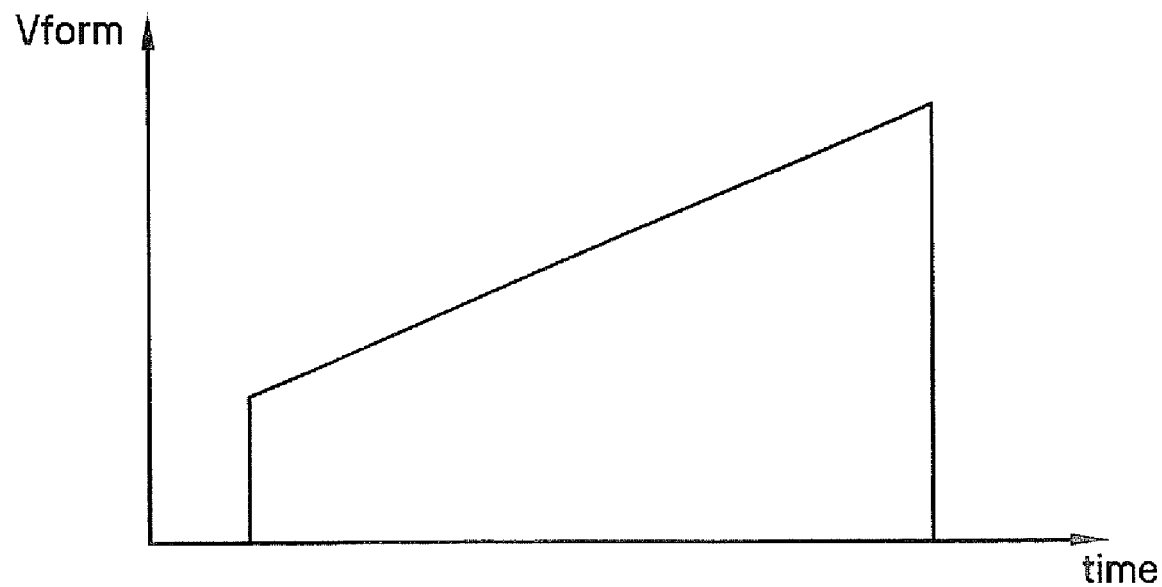
Figure 4C:
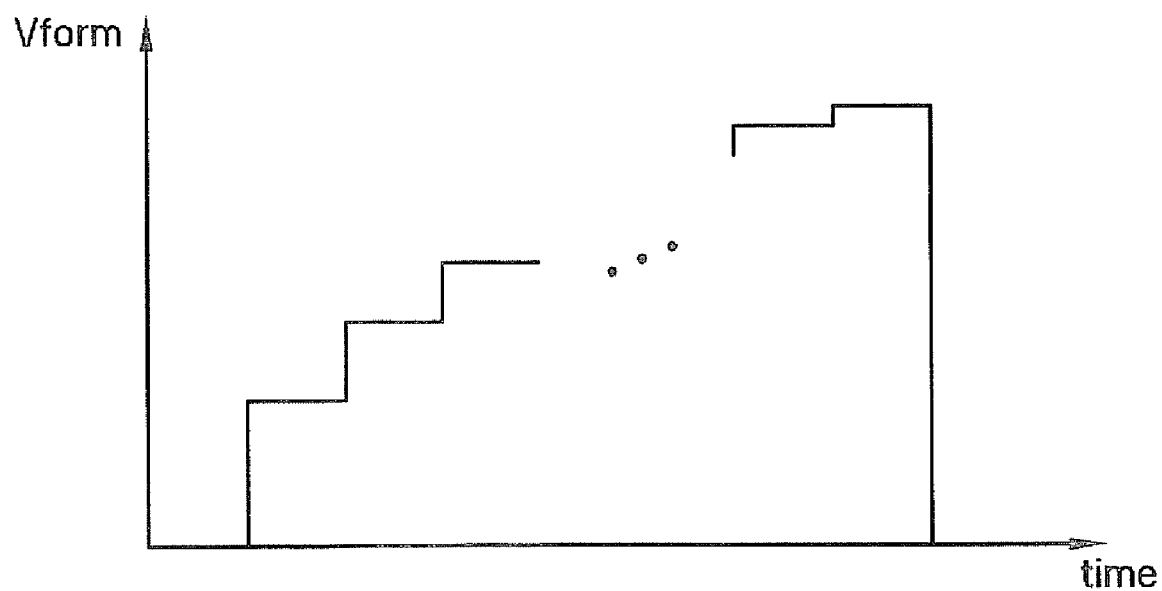
Figure 4D:
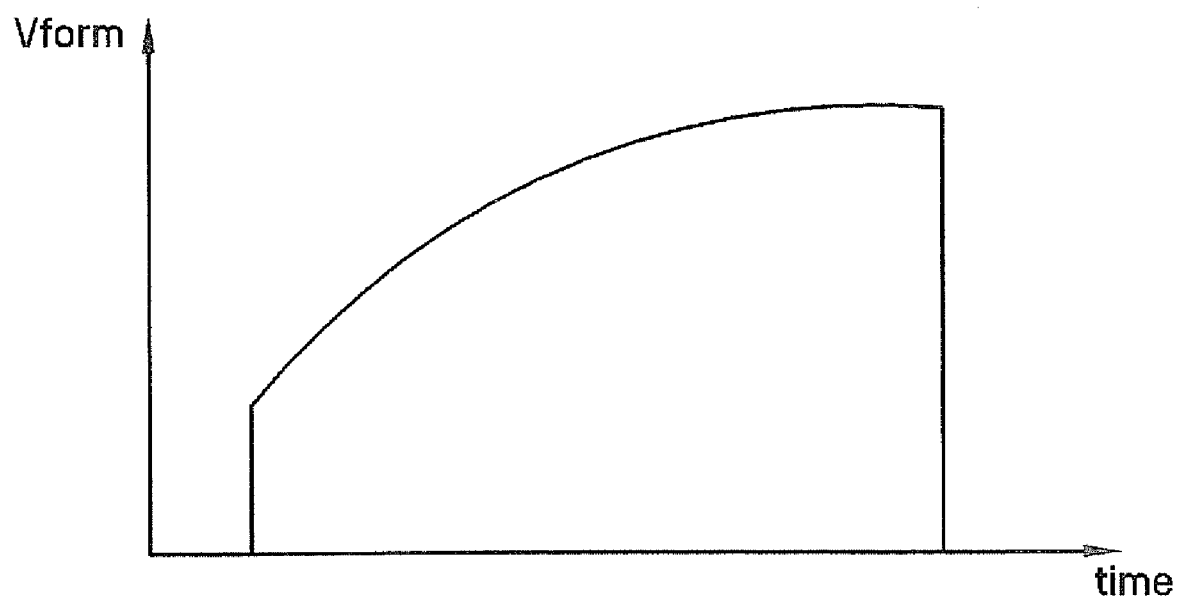

In an embodiment of the invention, it is possible to find a voltage level forming a filament having an appropriate thickness while gradually increasing the filament-forming voltage $V_{form}$ supplied to each resistive memory cell 112 from a predetermined voltage level. That is, it is sensed whether a filament having a predetermined thickness is formed in the variable resistive material of the resistive memory cell 112 while each filament-forming voltage is gradually increased from the predetermined voltage level. When a filament having the predetermined thickness is formed, the filament-forming voltage is not further increased. The voltage level of the filament-forming voltage $V_{form}$ may be gradually increased in a monotonic manner from the predetermined voltage level as shown in FIGS. 4A to 4D. The filament-forming voltage $V_{form}$ may be increased stepwise as shown in FIGS. 4A and 4C, it may be linearly increased as shown in FIG. 4B, or it may be non-linearly increased as shown in FIG. 4D. More specifically, FIG. 4A shows a case in which the voltage level by which the filament-forming voltage is increased is constant, and FIG. 4C shows a case in which the voltage level, by which the filament-forming voltage is gradually increased, decreases over time. Although not shown in FIGS. 4A to 4D, the voltage level, by which the filament-forming voltage is increased, may gradually increase over time. Also, FIG. 4B shows a case in which an increase in the voltage level over time is constant, and FIG. 4D shows a case in which an increase in the voltage level over time gradually decreases. Although not shown in FIGS. 4A to 4D, the rate of an increase in the voltage level with time may gradually increase over time.

As described above, when filament-forming voltages appropriate for the individual resistive memory cells 112, not filament-forming voltages having the same level, are applied to all of the resistive memory cells 112 of the memory cell array 110, it is possible to stably form filaments having desired thicknesses. That is, the variable resistive material Rc of some of the resistive memory cells 112 can be prevented from being broken down due to filament-forming voltages $V_{form}$ having high levels. When the filaments are excessively thick, transition from the set state to the reset state or transition from the reset state to the set state becomes difficult, and when the filaments are excessively thin, the amount of cell current is excessively small and thus it may be difficult to sense the flow of the cell current. In contrast, when the filaments are formed with appropriate thicknesses as in the embodiments of the invention, transition from the set state to the reset state or transition from the reset state to the set state becomes easy and the flow of the cell current is easily sensed.

Figure 5:
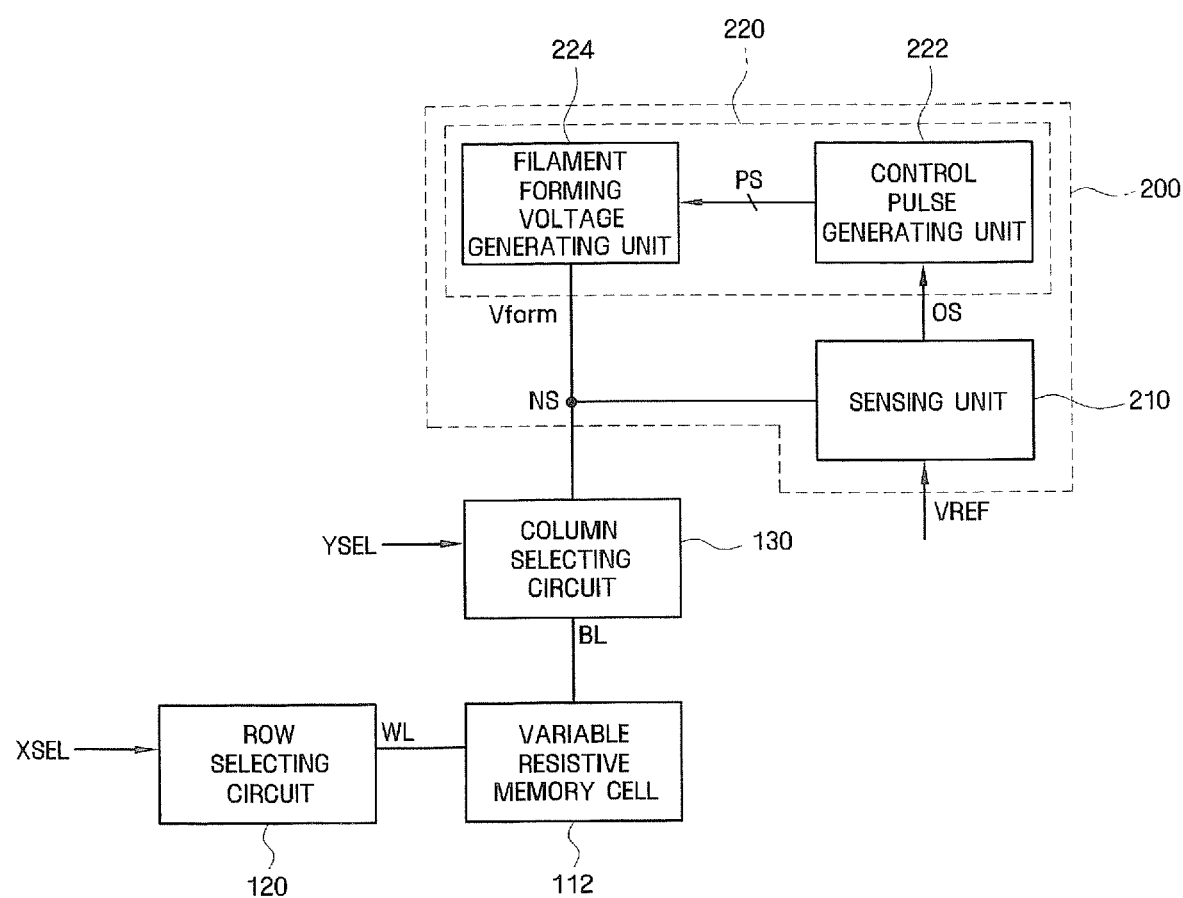
FIG. 5 is a block diagram illustrating a resistive memory device according to another embodiment of the invention.

FIG. 5 is a block diagram illustrating a resistive memory device according to another embodiment of the invention. FIG. 5 shows the filament-forming circuit 200 shown in FIG. 3 in more detail. FIG. 5 also shows the resistive memory cell 112 that is selected to form the filament among a plurality of resistive memory cells 112 in the memory cell array. More specifically, the column selecting circuit 130 receives a column selecting signal YSEL and selects a bit line BL, and the row selecting circuit 120 receives a row selecting signal XSEL and selects a word line WL, thereby selecting a predetermined resistive memory cell 112.

The filament-forming circuit 200 of the resistive memory device according to the embodiment of the invention supplies the filament-forming voltage $V_{form}$ to the selected resistive memory cell 112, senses a variation in the voltage level of a sensing node NS caused by a cell current Icell flowing through the selected resistive memory cell 112, and adjusts the voltage level of the filament-forming voltage $V_{form}$ on the basis of the sensed result.

The filament-forming circuit 200 of the resistive memory device includes the sensing node NS, a sensing unit 210, and a filament-forming voltage supplying unit 220. The sensing unit 210 compares the voltage level of the sensing node NS with the level of a reference voltage VREF and outputs the comparison result. For example, when the voltage level of the sensing node NS is lower than the level of the reference voltage VREF, the sensing unit 210 may supply an output signal OS having a high level. When the voltage level of the sensing node NS is higher than the level of the reference voltage VREF, the sensing unit 210 may supply the output signal OS having a low level. Although not shown in FIG. 5 in detail, for example, the sensing unit 210 may be composed of a sense amplifier for comparing the voltage level of the sensing node NS to the level of the reference voltage VREF and an A/D converter for converting an analog output of the sense amplifier to a digital signal.

The filament-forming voltage-supplying unit 220 supplies the filament-forming voltage $V_{form}$, and adjusts the voltage level of the filament-forming voltage $V_{form}$ on the basis of the output result of the sensing unit 210. More specifically, the filament-forming voltage supplying unit 220 may include a control pulse generating unit 222 that generates a plurality of control pulses PS by using the output signal OS (for example, an output signal OS having a high level) indicating that the voltage level of the sensing node NS is lower than the level of the reference voltage VREF and a filament-forming voltage-generating unit 224 that supplies the filament-forming voltage $V_{form}$ whose voltage level increases from a predetermined voltage level by using the plurality of control pulses PS.

Figure 6:
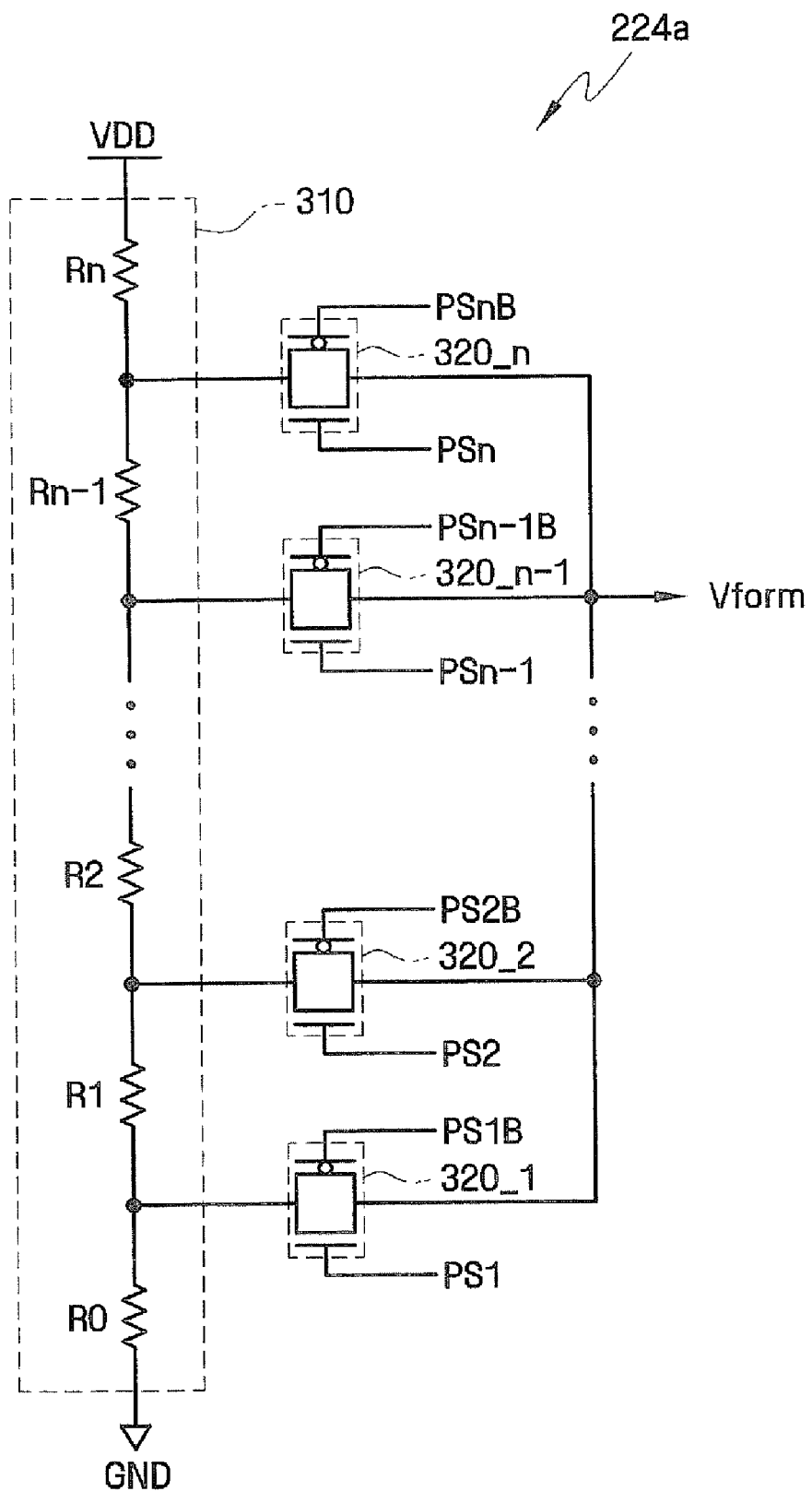
FIG. 6 is a circuit diagram illustrating an example of a filament-forming voltage-generating unit shown in FIG. 5.
Figure 7:
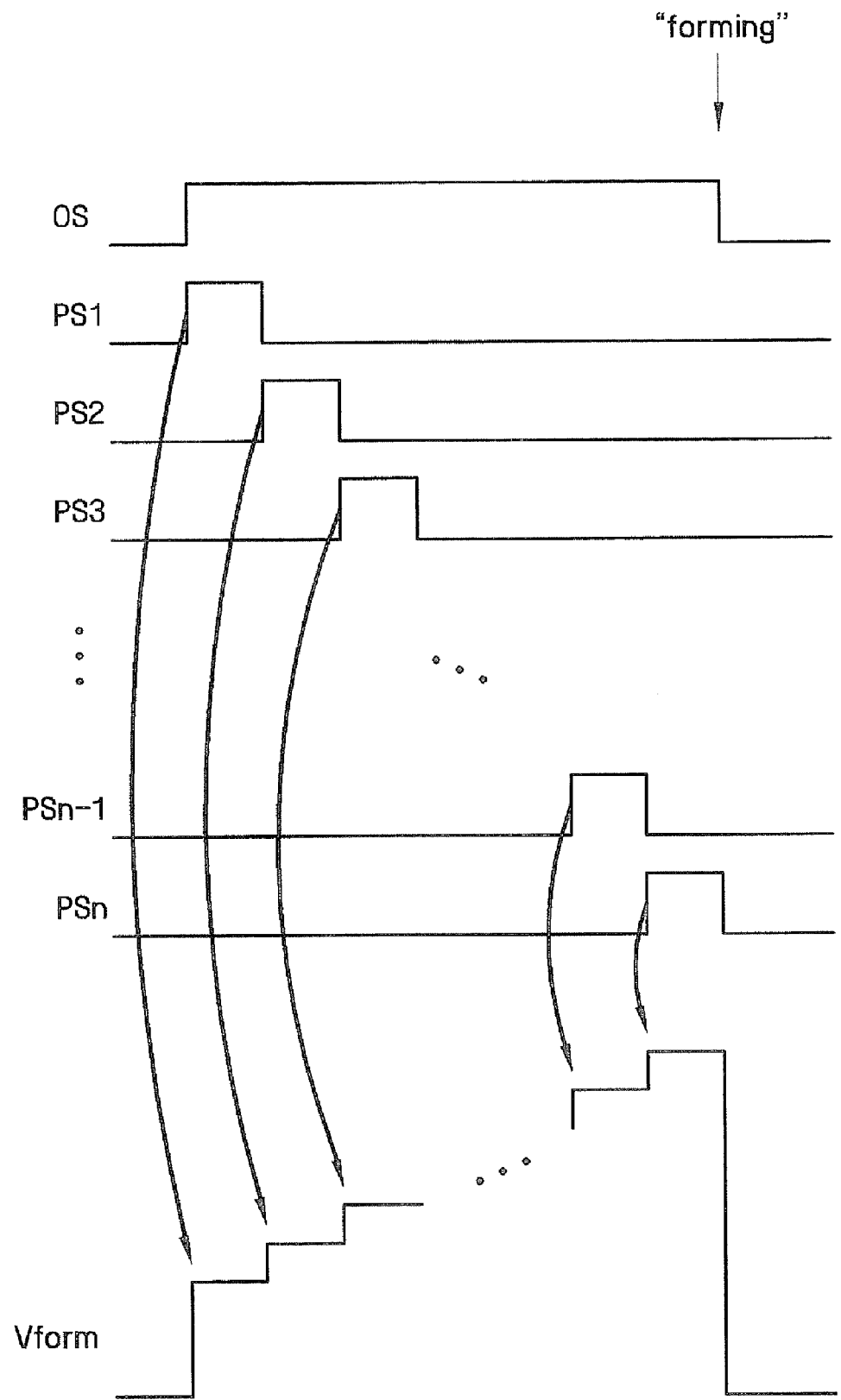
FIG. 7 is a timing chart illustrating the operation of the example of the filament-forming voltage-generating unit shown in FIG. 6.
Figure 8:
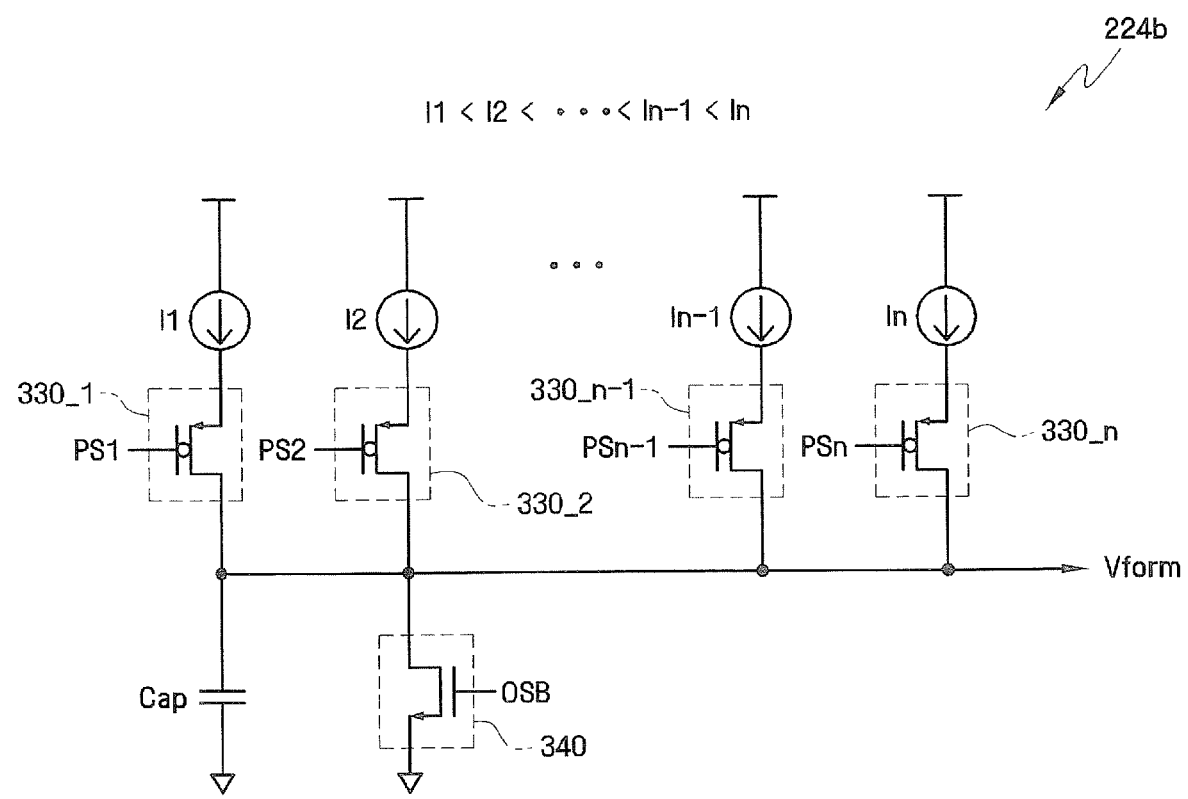
FIG. 8 is a circuit diagram illustrating another example of the filament-forming voltage-generating unit shown in FIG. 5.

The detailed circuit structure and operation of the filament-forming voltage-generating unit 224 will be described below with reference to FIGS. 6 to 9. FIG. 6 is a circuit diagram illustrating an example of the filament-forming voltage-generating unit shown in FIG. 5, and FIG. 7 is a timing chart illustrating the operation of the filament-forming voltage-generating unit shown in FIG. 6. FIG. 8 is a circuit diagram illustrating another example of the filament-forming voltage-generating unit for generating the filament-forming voltage shown in FIG. 4A.

Referring to FIG. 6, a filament-forming voltage-generating unit 224a includes a resistor string 310 including a plurality of resistors R0 to Rn connected in a totem-pole arrangement and a plurality of switches 320_1 to 320_n that are coupled to a plurality of nodes of the resistor string 310 and are tuned on in response to control pulses PS1 to PSn and PS1B to PSnB to output voltages of the nodes, respectively. In FIG. 6, transmission gates are used as the switches 320_1 to 320_n, but the invention is not limited thereto. The pulses PS1B to PSnB are inverted signals of the control pulses PS1 to PSn.

The operation of the filament-forming voltage-generating unit 224a will be described in detail with reference to FIGS. 6 and 7. When the voltage level of the sensing node NS is lower than the reference voltage level VREF and thus a high-level output signal OS is generated, the control pulse generating unit 222 uses the high-level output signal OS to sequentially supply the plurality of control pulses PS1 to PSn to the filament-forming voltage-generating unit 224a. The filament-forming voltage-generating unit 224a outputs the voltages of the nodes corresponding to the control pulses PS1 to PSn to generate the filament-forming voltages $V_{form}$. When filaments having a predetermined thickness are formed, the voltage level of the sensing node NS is higher than the level of the reference voltage VREF and thus a low-level output signal OS is generated. Therefore, the control pulses PS1 to PSn are not generated any more, so that the voltage level of the filament-forming voltage $V_{form}$ is not further increased.

Figure 9:
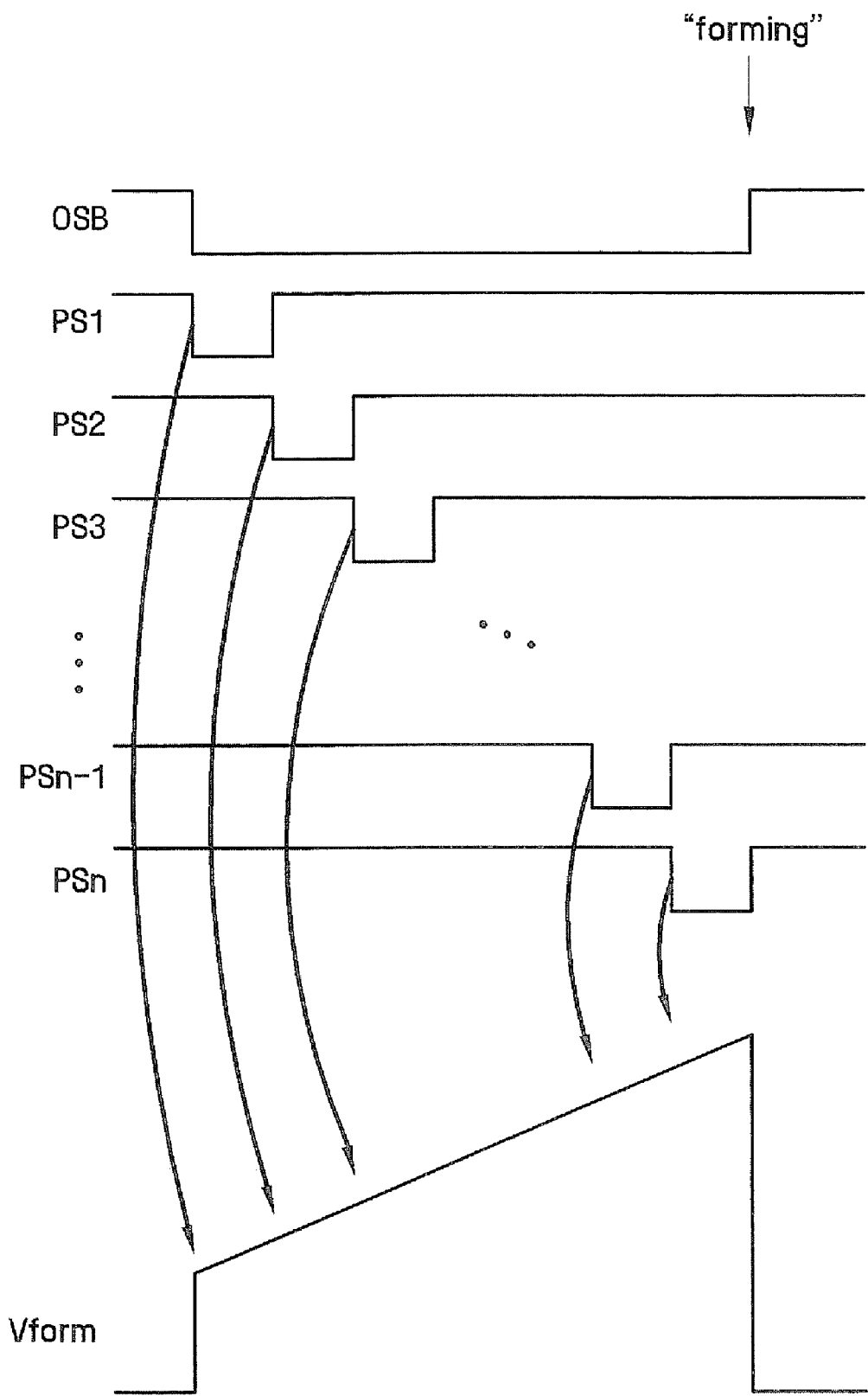
FIG. 9 is a timing chart illustrating the operation of another example of the filament-forming voltage-generating unit shown in FIG. 8.

FIG. 8 is a circuit diagram illustrating another example of the filament-forming voltage-generating unit shown in FIG. 5, and FIG. 9 is a timing chart illustrating the operation of the filament-forming voltage-generating unit shown in FIG. 8. Specifically, FIG. 8 is a circuit diagram illustrating an example of a circuit structure for generating the filament-forming voltage shown in FIG. 4C.

Referring to FIG. 8, a filament-forming voltage-generating unit 224b includes a plurality of current sources I1 to In for supplying different currents (for example, I1<I2< ... <In−1<In) and a plurality of switches 330_1 to 330_n that are respectively coupled to the current sources I1 to In and are turned on in response to control pulses PS1 to PSn to output currents from the current sources In to In, respectively. In FIG. 8, PMOS transistors are used as the switches 330_1 to 330_n, but the invention is not limited thereto. In addition, the filament-forming voltage-generating unit 224b includes a transistor 340 that is turned on in response to an inverted signal OSB of the output signal from the sensing unit 210 and a capacitor Cap that temporarily stores the current supplied from the plurality of current sources I1 to In. The charge on the capacitor Cap can be reset when the signal OSB transitions low-to-high.

The operation of the filament-forming voltage-generating unit 224b will be described with reference to FIGS. 8 and 9. A plurality of control pulses PS1 to PSn generated on the basis of the inverted signal OSB of the output signal from the sensing unit 210 are sequentially supplied to the filament-forming voltage-generating unit 224b. Then, in the filament-forming voltage-generating unit 224b, the current sources I1 to In corresponding to the control pulses PS1 to PSn output currents to generate the filament-forming voltage $V_{form}$. When filaments having a predetermined thickness are formed, the filament voltage-generating unit does not further increase the voltage level of the filament-forming voltage.

Figure 10:
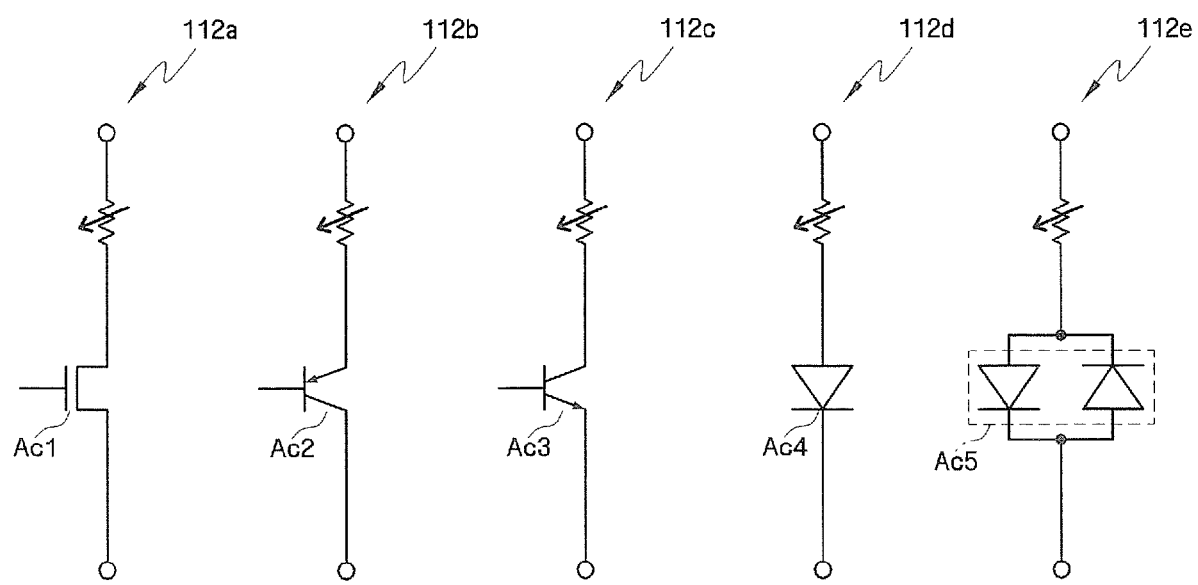
FIG. 10 is a circuit diagram illustrating various examples of resistive memory cells used for the resistive memory devices according to the embodiments of the invention.

FIG. 10 is a circuit diagram illustrating various examples of resistive memory cells used for the resistive memory devices according to the embodiments of the invention. Referring to FIG. 10, various types of elements may be used as access elements of the resistive memory cells 112. That is, an FET may be used as an access element Ac1 of a resistive memory cell 112a, and a PNP bipolar transistor may be used as an access element Ac2 of a resistive memory cell 112b. In addition, an NPN bipolar transistor may be used as an access element Ac3 of a resistive memory cell 112c, and a diode may be used as an access element Ac4 of a resistive memory cell 112d. Further, two diodes arranged in opposite directions are used as an access element Ac5 of a resistive memory cell 112e. However, the non-volatile memory device according to the invention is not limited thereto.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. An integrated circuit memory device, comprising:
a memory cell having a non-volatile data storage region therein comprising a multi-filament variable resistivity material; and
a filament-forming circuit electrically coupled to a terminal of said memory cell during a filament-forming operation, said filament-forming circuit configured to drive the terminal with a monotonically increasing sequence of voltages that operate to vary resistances of the filaments within the variable resistivity material during the filament-forming operation.

2. The memory device of claim 1, wherein the multi-filament variable resistivity material is a perovskite material.

3. The memory device of claim 1, wherein the monotonically increasing sequence is a stair-step sequence.

4. The memory device of claim 1, wherein said filament-forming circuit comprises a sense amplifier configured to sense a magnitude of the monotonically increasing sequence of voltages relative to a reference voltage.

5. The memory device of claim 4, wherein said filament-forming circuit comprises a string of resistors connected in a totem-pole arrangement between first and second supply voltages; and wherein said filament-forming circuit is configured to sequentially connect nodes of the string of resistors to the terminal of said memory cell during the filament-forming operation.

6. A non-volatile memory device, comprising:
an array of memory cells having non-volatile data storage regions therein that comprise multi-filament variable resistivity materials;
a plurality of bit lines electrically coupled to corresponding columns of memory cells in said array;
a filament-forming circuit configured to generate a monotonically increasing sequence of voltages during a filament-forming operation; and
a column selecting circuit configured to route the monotonically increasing sequence of voltages from said filament-forming circuit to at least a selected one of said plurality of bit lines during the filament-forming operation.

7. The memory device of claim 6, wherein the multi-filament variable resistivity materials comprise a perovskite material.

8. The memory device of claim 6, wherein the monotonically increasing sequence is a stair-step sequence.

9. The memory device of claim 6, wherein the monotonically increasing sequence is a linear ramp-shaped sequence.

10. The memory device of claim 6, wherein said filament-forming circuit comprises a sense amplifier configured to sense a magnitude of the monotonically increasing sequence of voltages relative to a reference voltage.

11. The memory device of claim 8, wherein said filament-forming circuit comprises a string of resistors connected in a totem-pole arrangement between first and second supply voltages; and wherein said filament-forming circuit is configured to sequentially connect nodes of the string of resistors to an output thereof during the filament-forming operation.

12. The memory device of claim 9, wherein said filament-forming circuit comprises a plurality of unequal current sources and a capacitor and is configured to selectively drive the capacitor with a sequence of currents generated by the plurality of unequal current sources.

13. The memory device of claim 10, wherein said filament-forming circuit comprises a string of resistors connected in a totem-pole arrangement between first and second supply voltages; and wherein said filament-forming circuit is configured to sequentially connect nodes of the string of resistors to an output thereof during the filament-forming operation.

14. The memory device of claim 13, wherein said sense amplifier is configured to generate an output signal having a value that reflects a magnitude of the monotonically increasing sequence of voltages relative to a magnitude of the reference voltage; and wherein said filament-forming circuit comprises a control pulse generating circuit responsive to the output signal.

15. A resistive memory device comprising:
a plurality of word lines and a plurality of bit lines arranged so as to intersect each other;
a plurality of resistive memory cells each having a variable resistive material and an access element coupled between the corresponding word line and the corresponding bit line;
selecting circuits selecting one of the plurality of resistive memory cells; and
a filament-forming circuit supplying a filament-forming voltage to the selected resistive memory cell through the bit line coupled to the selected resistive memory cell, the filament-forming voltage increasing from a predetermined voltage level until filaments having a predetermined thickness are formed in the variable resistive material of the selected resistive memory cell.

16. The resistive memory device of claim 15, wherein:
the filament-forming circuit comprises:
a sensing node on which the voltage level varies according to a cell current flowing through the selected resistive memory cell when the filament-forming voltage is applied;
a sensing unit comparing the voltage level of the sensing node to a reference voltage level and outputting the comparison result; and
a filament-forming voltage supplying unit supplying the filament-forming voltage to the selected resistive memory cell, the voltage level of the filament-forming voltage increasing on the basis of the comparison result output from the sensing unit.

17. The resistive memory device of claim 16, wherein:
the sensing unit supplies an output signal indicating that the voltage level of the sensing node is lower than the reference voltage level, and
the filament-forming voltage-supplying unit comprises a control pulse-generating unit generating a plurality of control pulses by using the output signal and a filament-forming voltage-generating unit supplying the filament-forming voltage that is gradually increased, from the predetermined voltage level on the basis of the plurality control pulses.

18. The resistive memory device of claim 17, wherein:
the filament-forming voltage-generating unit comprises:
a resistor string including a plurality of resistors; and
a plurality of switches that are coupled to a plurality of nodes of the resistor string and are turned on in response to the control pulses to output voltages of the nodes, respectively.

19. The resistive memory device of claim 17, wherein:
the filament-forming voltage-generating Unit comprises:
a plurality of current sources; and
a plurality of switches that are respectively coupled to the current sources and are turned on in response to the control pulses to output currents from the current sources.

20. The resistive memory device of claim 17, wherein the filament-forming voltage increases stepwise.

21. The resistive memory device of claim 17, wherein the filament-forming voltage increases linearly or non-linearly.

22. A resistive memory device comprising:
a plurality of resistive memory cells each having a variable resistive material whose resistance level varies according to data to be stored; and
a filament-forming circuit supplying a filament-forming voltage that is gradually increased from a predetermined voltage level to each of the resistive memory cells to form filaments in the variable resistive material of each of the resistive memory cells.

23. The resistive memory device of claim 22, wherein the filament-forming voltage increases stepwise.

24. The resistive memory device of claim 22, wherein the filament-forming voltage increases linearly or non-linearly.

* * * * *